US009381682B2

(12) United States Patent
Zhao et al.

(10) Patent No.: US 9,381,682 B2
(45) Date of Patent: Jul. 5, 2016

(54) DEVICE AND METHOD FOR ADJUSTING POST-SPACER HEIGHT IN PRODUCTION OF LIQUID CRYSTAL DISPLAYS

(71) Applicant: BEIJING BOE OPTOELECTRONICS TECHNOLOGY CO., LTD., Beijing (CN)

(72) Inventors: Chengtan Zhao, Beijing (CN); Tae Yup Min, Beijing (CN); Xu Chen, Beijing (CN); Hui Li, Beijing (CN); Weixin Meng, Beijing (CN); Lang Zhang, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 442 days.

(21) Appl. No.: 14/117,208

(22) PCT Filed: Dec. 18, 2012

(86) PCT No.: PCT/CN2012/086843
§ 371 (c)(1),
(2) Date: Nov. 12, 2013

(87) PCT Pub. No.: WO2013/143328
PCT Pub. Date: Oct. 3, 2013

(65) Prior Publication Data
US 2015/0108672 A1   Apr. 23, 2015

(30) Foreign Application Priority Data

Mar. 30, 2012 (CN) .......................... 2012 1 0092023
May 11, 2012 (CN) .......................... 2012 1 0147493

(51) Int. Cl.
B29C 37/00    (2006.01)
H01L 21/02    (2006.01)
G02F 1/1339   (2006.01)
B29L 7/00     (2006.01)

(52) U.S. Cl.
CPC .......... B29C 37/005 (2013.01); G02F 1/13394 (2013.01); H01L 21/02656 (2013.01); *B29L 2007/00* (2013.01); *G02F 2201/503* (2013.01)

(58) Field of Classification Search
CPC .............. B29C 37/005; G02F 1/13394; H01L 21/02656
See application file for complete search history.

(56) References Cited

FOREIGN PATENT DOCUMENTS

| CN | 102778788 A | 11/2012 |
| JP | 2000-310772 A | 11/2000 |
| JP | 2007-163296 A | 6/2007 |
| KR | 1020070042380 A | 4/2007 |

OTHER PUBLICATIONS

International Preliminary Report on Patentability Appln. No. PCT/CN2012/086843; Dated Oct. 1, 2014.
First Chinese Office Action Appln. No. 20121014793.2; Dated Jan. 26, 2015.
International Search Report mailed Mar. 28, 2013; PCT/CN2012/086843.
Written Opinion of the International Searching Authority Appln. No. PCT/CN2012/086843; Dated Mar. 28, 2013.

*Primary Examiner* — James Sanders
(74) *Attorney, Agent, or Firm* — Ladas & Parry LLP

(57) ABSTRACT

A device and a method for adjusting post-spacer height in production of liquid crystal displays (LCDs), and the device comprises a controller (11) and an extrusion panel (12), the controller (1) is configured to control the extrusion panel (12) to perform plastic deformation treatment; and the extrusion panel (12) is configured to perform plastic deformation treatment on post spacers on a substrate, of which a height is more than a predetermined height value, under the control of the controller (11) after a rubbing process and before a cell assembly process, so that the standard deviation of the post-spacer height on the substrate can fall in a range of the predetermined standard deviation required to be achieved by products. The device and the method can effectively improve the uniformity of the post-spacer height on the substrates.

9 Claims, 1 Drawing Sheet

DEVICE AND METHOD FOR ADJUSTING POST-SPACER HEIGHT IN PRODUCTION OF LIQUID CRYSTAL DISPLAYS

TECHNICAL FIELD

Embodiments of the present invention relate to a device and a method for adjusting the height of post spacer (PS) in the production of liquid crystal displays (LCDs).

BACKGROUND

LCDs are commonly used flat panel displays currently, and thin-film transistor liquid crystal displays (TFT-LCDs) are the mainstream product among LCDs.

An LCD panel is an important component of an LCD. The production process of an LCD panel is as follows: firstly, an array substrate and a color filter (CF) substrate are produced; and secondly, the CF substrate and the array substrate are assembled by a cell assembly process to form the LCD panel. The cell assembly process may specifically include: dripping liquid crystals on the array substrate or the CF substrate by one drop filling (ODF) process; coating sealant on the other substrate; and subsequently, forming the LCD panel by cell assembling the array substrate and the CF substrate. The uniformity of the cell gap of the formed LCD panel is determined by the uniformity of the post spacers between the CF substrate and the array substrate, and that all the post spacers on the CF substrate and/or the array substrate have relatively uniform height also ensures the product quality under a fixed amount of the liquid crystals. The requirement on the accuracy of the cell gap of the LCD panel is particularly high in the fields of military application, scientific research application and the like having higher requirement on the accuracy. But generally, the height fluctuation of the post spacers between the CF substrate and the array substrate, produced by the patterning process, is unavoidable. Therefore, the adjustment of the post spacers so that the post spacers have uniformity is particularly important.

For the convenience of description, the CF substrate and the array substrate herein are referred to as "substrate" in the following description.

The standard of measuring the uniformity of the post-spacer height (height distribution) is generally that the standard deviation of the post-spacer height is required to be as small as possible. In actual production, if the height uniformity of the produced post spacers is poor, the production of the panel may be adversely affected. The nonuniformity of the post-spacer height on the substrate may be specifically embodied in the fluctuation of the mean value of the post-spacer height among glass substrates and the fluctuation of the heights of various post spacers on panels from one glass substrate.

In the actual production process, the post-spacer height on the substrate obtained after rubbing process has a great impact on the characteristics of the panel, which shows particularly as follows: as the CF substrate and the array substrate obtained after rubbing process are required to be directly subjected to a cell assembly process, poor uniformity of the post-spacer height on the substrates may directly result in the case that the amount of the liquid crystals in the final panel product is not comparable with the post-spacer height, and hence the produced panel may have poor quality. Specifically, as only several post spacers are selected for measurement during the measurement, and it is impossible to reflect the heights of the post spacers on the whole substrate, namely the actual heights of the post spacers on the substrate cannot be reflected. If the measured post-spacer height on the substrate is less than the actual post-spacer height, when a corresponding amount of the liquid crystals are filled according to the measured post-spacer height on the substrate, the phenomena such as low-temperature bubbles will occur; and if the measured post-spacer height on the substrate is more than the actual post-spacer height, when a corresponding amount of the liquid crystals are filled according to the measured post-spacer height on the substrate, the phenomena such as gravity mura will occur. At present, the main solution to this is as follows: the heights of the post spacers on the substrate are extensively measured, and the amount of the filled liquid crystals is accordingly changed. But the solution has certain defect: the amount of the filled liquid crystals is required to be changed along with the fluctuation of the post-spacer height, but the change of the amount of the liquid crystals may result in the change of the cell gap of the panel, and hence the optical property of a final product will be affected.

SUMMARY

For that reason, the main objective of the present invention is to provide a device and method for adjusting post-spacer height in production of LCDs. The device and the method can effectively improve the uniformity of the post-spacer height on a substrate.

In order to achieve the objective, the technical proposal of the present invention is as follows.

In one aspect, the present invention provides a device for adjusting post-spacer height in production of LCDs. The device comprises a controller and an extrusion panel, wherein the controller is configured to control the extrusion panel so as to perform plastic deformation treatment on the post spacers; and the extrusion panel is configured to perform plastic deformation treatment on the post spacers on a substrate, of which heights are more than a predetermined height value, under the control of the controller after a rubbing process and before a cell assembly process, so that a standard deviation of the post-spacer height on a substrate can fall in a range of a predetermined standard deviation required to be achieved by products.

In one embodiment of the present invention, the extrusion panel further comprises a support table and a plurality of extruding rods which are separately actuated on the support table.

In another embodiment of the present invention, the controller may be also configured to acquire height values and the coordinate values of the post spacers on the substrates, of which the heights are more than the predetermined height value; and the controller controls corresponding pressure applied by the extruding rods to post spacers at corresponding positions according to the height value and the coordinate values of each post spacer on the substrate, of which the height is more than the predetermined height value.

For instance, the extruding rods are small rigid rods.

For instance, the extruding rods are uniformly distributed on the support table.

In still another embodiment of the present invention, the device further comprises a support base for placing the substrate.

In the embodiments of the present invention, the controller may be a programmable logic controller (PLC).

In another aspect, the present invention also provides a method for adjusting post-spacer height in production of LCDs. The method comprises the following steps of:

a) setting a height value for post spacers; and b) employing a controller to control an extrusion panel to perform plastic deformation treatment on post spacers on a substrate, of which heights are more than the predetermined height value, after a rubbing process and before a cell assembly process, so that a standard deviation of the post-spacer height on the substrate can fall in a range of a predetermined standard deviation required to be achieved by products.

In one embodiment of the present invention, the step b) may further comprise the following steps of:

employing the controller to acquire the height values and the coordinate values of the post spacers on the substrate, of which the heights are more than the predetermined height value; and employing the controller to control the extrusion panel to perform plastic deformation treatment on the post spacers on the substrate, of which the heights are more than the predetermined height value, according to the height values and the coordinate values of the post spacers, acquired by the controller.

In another embodiment of the present invention, the process of the plastic deformation treatment is conducted as follows by:

employing the controller to control extruding rods at corresponding positions of the extrusion panel to apply corresponding pressures on corresponding post spacers according to the positions of post spacers, of which the heights are more than the predetermined height value.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Figure 1:
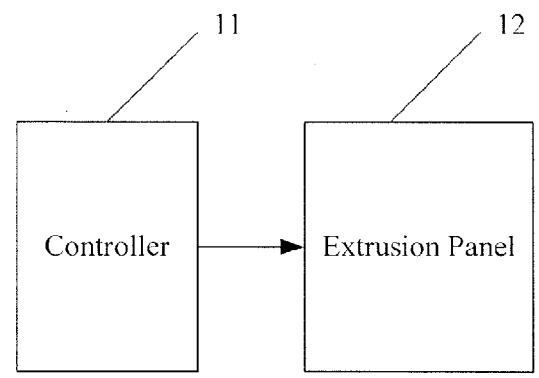
FIG. 1 is a schematic diagram of a device for adjusting post-spacer height in production of LCDs according to an embodiment of the present invention.

FIG. 1 is a schematic diagram of a device for adjusting post-spacer height in production of LCDs according to an embodiment of the present invention. The device comprises a controller 11 and an extrusion panel 12; the controller 11 is configured to control the extrusion panel 12 to perform plastic deformation treatment on the post spacers.

The extrusion panel 12 is configured to perform plastic deformation treatment on the post spacers on substrates, of which the heights are more than a predetermined height value, under the control of the controller 11, after a rubbing process and before a cell assembly process, so that the standard deviation of the post-spacer height on the substrates can fall in the range of the predetermined standard deviation required to be achieved by products.

The controller 11 may be also configured to acquire the height values and the coordinate value of the post spacers on a substrate, of which the heights are more than the predetermined height value. In the embodiment, in the actual production process, the controller 11 can directly acquire the height values and the coordinate values of various post spacers on the substrate, of which the heights are more than the predetermined height value, through the conventional device(s) for measuring the post-spacer height.

In the embodiment, the controller 11, for instance, may be a PLC. Of course, the controller 11 may also be an appropriate controller of other type.

Figure 2:
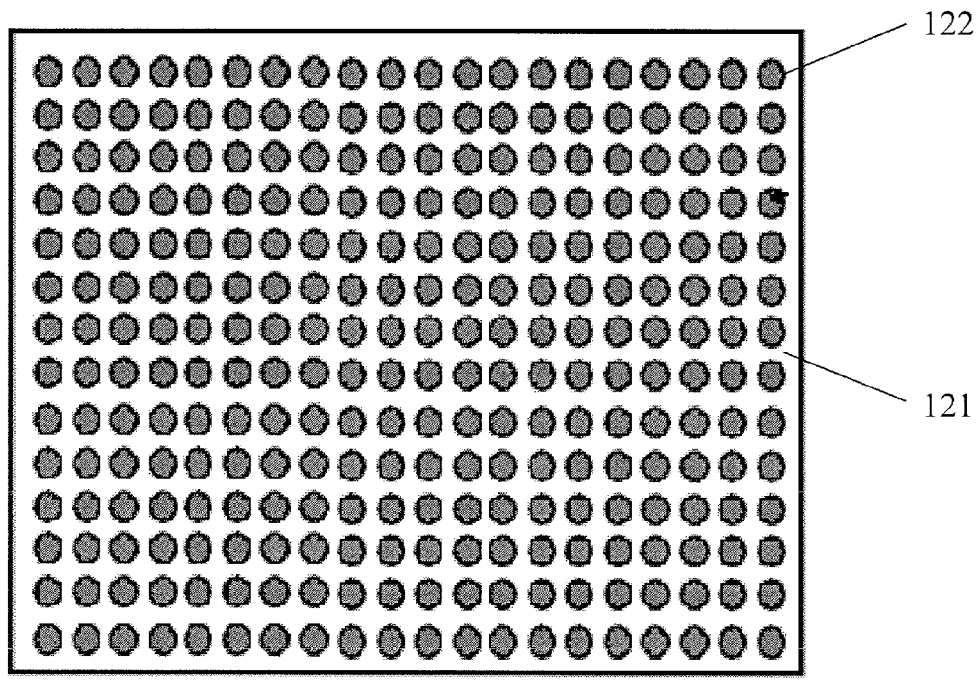
FIG. 2 is a top view of an extrusion panel as illustrated in FIG. 1.

In the embodiment, the extrusion panel 12 has an extruding structure which is adapted to extrude the post spacers and of which each part can be separately actuated. As illustrated in FIG. 2, the extrusion panel 12 may comprise a support table 121 and a plurality of extruding rods 122 which can be each separately actuated on the support table 121. In the embodiment, the support table 121 may be made of any available material adapted to form the support table. For instance, the extruding rods 122 are small rigid rods and made of a material with strong rigidity, e.g., stainless steel. In the embodiment, the extruding rods 122 can move on the support table 121 along the direction perpendicular to the table 121, and each extruding rod 122 can be separately actuated to apply different pressures to each of the post spacers according to different heights of the post spacers. For instance, the extruding rods 122 may be uniformly distributed on the support table 121. As seen from FIG. 2, the extruding rods 122 are regularly arranged on the support table 121. In this way, different production requirements can be met. That is to say, when the heights of the post spacers at different positions of different substrates are required to be adjusted, the device provided by the embodiment of the present invention can control the standard deviation of the heights of the post spacers on the substrates to fall in the range of the predetermined standard deviation required to be achieved by products, by applying pressure to the post spacers at specific positions through the extruding rods 122 at corresponding positions according to the specific positions of the post spacers.

Correspondingly, the controller 11 controls the corresponding extruding rods 122 of the extrusion panel 12 to apply corresponding pressures to the post spacers at corresponding positions according to the height values and the coordinate values of various post spacers on the substrates, of which the heights is more than the predetermined height value.

In the embodiment, the device may further comprise a support base for placing the substrates. During the placement, the glass substrates of the array substrate and the CF substrate make contact with the support base. In order to guarantee the uniformity of the post-spacer height on the substrates, the support base is required to have a good evenness. In addition, the support base may be made of any material having a certain supporting capacity.

For instance, taking a 3.0-inch product produced by a five-generation production line as example, the 3.0-inch product is a small-size product; and supposing that the number of small panels on each glass substrate is 6×57=342, due to the large number of the small panels, the uniformity of the post-spacer height on the substrates of each panel is very difficult to control. The fluctuation range of the amount of filled liquid crystals is 2 to 10 percent with respect to the central value in the light of the production experience. That is to say, if the amount of the filled liquid crystals is less than the central value by 2 percent, the problem of low-temperature bubbles will occur; and if the amount of the filled liquid crystals is more than the central value by 10 percent, the problem of gravity mura will occur, and hence the problem of poor product quality will occur. Based on the corresponding relationship between the amount of the liquid crystals and the post-spacer height, the result may be as follows: the above problems will occur as long as the fluctuation range of the post-spacer height on the substrates is beyond 0.1 micrometer. Therefore, the requirements cannot be met by adoption of the current production process of the post spacers and the LCD panels, that is to say, the fluctuation range of the post-spacer height on the substrates of each produced panel has been beyond 0.1 micrometer by adoption of the conventional production processes of the post spacers and the LCD panels.

The nonuniformity of the post-spacer height on the substrates may be embodied in the fluctuation of the mean value of the post-spacer height among glass substrates and the fluctuation of the heights of various post spacers on panels from one glass substrate. According to the actual production condition, the fluctuation range of the post-spacer height among the glass substrates is approximately between 0.1 and 0.3 micrometer; the fluctuation range of the post-spacer height among various panels in the same glass substrate is approximately between 0.1 and 0.2 micrometer; and the range of the post-spacer height of a small-size product, for instance, a 3.0-inch product, will be more sensitive, that is, the fluctuation range of the post-spacer height of the small-size product should be narrower. Therefore, by adoption of the device provided by the embodiment of the present invention, the uniformity of the post-spacer height on the substrates of the small-size product can be greatly improved.

In practice, at first, the height and the corresponding coordinate values of each post spacer on the whole glass substrate obtained after rubbing process are measured, and the distribution chart of the post-spacer height on the whole glass substrate can be obtained according to the measured height value and the measured corresponding coordinate values of each post spacer; the controller 11 is configured to control extruding rods 122 corresponding to positions of the post spacers of which the heights are more than the predetermined height value to apply corresponding pressures to the post spacers at the positions according to the obtained distribution chart of the post-spacer height and a plastic deformation curve of the post spacers; and when the pressure is applied, higher pressure is applied to the post spacers of which the heights are significantly more than the predetermined height, so that the post spacers are subjected to plastic deformation, and finally the standard deviation of the post-spacer height on the whole glass substrate is enabled to fall in the range of the predetermined standard deviation required to be achieved by the products. Moreover, as the completely same production process is applied to products with the same size, the controller 11 may control the extruding rods 122 to apply the same pressure to the post spacers at corresponding positions of other glass substrates according to the obtained distribution chart of the post-spacer height and the obtained plastic deformation curve of the post spacers, after the distribution chart of the post-spacer height on the whole glass substrate is obtained, so that the production efficiency can be improved.

In another embodiment of the present invention, a method for adjusting post-spacer height in production of LCDs is also provided based on the device. The method comprises the following steps.

Step a): setting a height value for post spacers.

In this step, the height value of the post spacers can be set according to the performances, required to be achieved, of produced panel products, and the standard deviation of the post-spacer height, required to be achieved, with experience.

Step b): employing a controller to control an extrusion panel to perform plastic deformation treatment on post spacers on a substrate, of which the heights are more than the predetermined height value, after a rubbing process and before a cell assembly process, so that the standard deviation of the post-spacer height on the substrates can fall in the range of the predetermined standard deviation required to be achieved by products.

The step b) may further comprise the following steps of: employing a controller to acquire the height values and the coordinate values of post spacers on the substrate, of which the heights are more than a predetermined height value:

employing the controller to control an extrusion panel to perform plastic deformation treatment on the post spacers on the substrate, of which the heights are more than the predetermined height value, after acquiring the height values and the coordinate values of the post spacers, in which the treatment process includes:

employing the controller to control corresponding extruding rods of the extrusion panel to apply corresponding pressures to the post spacers, at corresponding positions according to the height value and the coordinate values of each post spacer on the substrate, of which the height is more than the predetermined height value.

Moreover, before the step b), the method may further comprise the following step of: placing a substrate on a support base.

After the substrate is placed on the support base, the glass substrate of the substrate makes contact with the support base.

According to the device and the method for adjusting post-spacer height in production of the LCDs, provided by the embodiments of the present invention, the controller is configured to control the extrusion panel to perform plastic deformation treatment on post spacers on a substrate, of which the heights are more than a predetermined height value, after a rubbing process and before a cell assembly process, so that the standard deviation of the post-spacer height on the substrate can fall in the range of the predetermined standard deviation required to be achieved by the products. Therefore, the uniformity of the post-spacer height on the substrate can be effectively improved in the production of the LCDs.

The above description is only illustrative but not limitative to the present invention. It should be understood by those skilled in the art that various modifications, changes or equivalents can be made without departing from the spirit and scope defined by the appended claims and should all fall within the protection scope of the present invention.

The invention claimed is:

1. A device for adjusting post-spacer height in production of liquid crystal displays (LCD), comprising a controller and an extrusion panel, wherein the controller is configured to control the extrusion panel to perform plastic deformation treatment on post spacers and acquire height values and coordinate values of the post spacers on the substrate, of which the heights are more than the predetermined height value;

the extrusion panel is configured to perform plastic deformation treatment on the post spacers on a substrate, of which heights are more than a predetermined height value, according to the height values and the coordinate values of the post spacers acquired by the controller, under the control of the controller after a rubbing process and before a cell assembly process, so that the standard deviation of the post-spacer height on a substrate can fall in a range of a predetermined standard deviation required to be achieved by products; and the extrusion panel further comprises a support table and a plurality of extruding rods which are separately actuated on the support table.

2. The device according to claim 1, wherein the controller is also configured to acquire height values and coordinate values of the post spacers on the substrate, of which the heights are more than the predetermined height value; and the controller controls the extruding rods to apply corresponding pressures to the post spacers at corresponding positions according to acquired height values and acquired coordinate values of the post spacers on the substrate, of which the heights are more than the predetermined height value.

3. The device according to claim 1, wherein the extruding rods are small rigid rods.

4. The device according to claim 1, wherein the extruding rods are uniformly distributed on the support table.

5. The device according to claim 1, wherein the device further comprises a support base for placing the substrate.

6. The device according to claim 1, wherein the controller is a programmable logic controller (PLC).

7. A method for adjusting post-spacer height in production of LCDs, comprising the following steps of:

a) setting a height value for post spacers; and b) employing a controller to control an extrusion panel to perform plastic deformation treatment on post spacers on a substrate, of which heights are more than the predetermined height value, after a rubbing process and before a cell assembly process, so that a standard deviation of the post-spacer height on the substrate can fall in a range of a predetermined standard deviation required to be achieved by products;

wherein the step b) further comprises the following steps of:

employing a controller to acquire height values and coordinate values of the post spacers on the substrate, of which the heights are more than the predetermined height value; and employing the controller to control an extrusion panel to perform plastic deformation treatment on the post spacers on the substrate, of which the heights are more than the predetermined height value, according to the height values and the coordinate values of the post spacers acquired by the controller, wherein the process of the plastic deformation treatment is conducted as follows by:

employing the controller to control extruding rods at corresponding positions of the extrusion panel to apply corresponding pressures on corresponding post spacers according to the positions of post spacers, of which the heights are more than the predetermined height value.

8. The device according to claim 2, wherein the extruding rods are small rigid rods.

9. The device according to claim 2, wherein the extruding rods are uniformly distributed on the support table.

* * * * *